US011868220B2

(12) United States Patent
Fackenthal et al.

(10) Patent No.: US 11,868,220 B2
(45) Date of Patent: Jan. 9, 2024

(54) EFFICIENT POWER SCHEME FOR REDUNDANCY

(71) Applicant: Micron Technology, Inc., Boise, ID (US)

(72) Inventors: Richard E. Fackenthal, Carmichael, CA (US); Duane R. Mills, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 991 days.

(21) Appl. No.: 16/446,457

(22) Filed: Jun. 19, 2019

(65) Prior Publication Data

US 2020/0401490 A1  Dec. 24, 2020

(51) Int. Cl.
  *G11C 29/44*    (2006.01)
  *G06F 11/20*    (2006.01)
  *G06F 12/02*    (2006.01)
  *G11C 7/10*     (2006.01)
  *G11C 16/08*    (2006.01)

(52) U.S. Cl.
  CPC .......... *G06F 11/2015* (2013.01); *G06F 12/02* (2013.01); *G11C 7/1087* (2013.01); *G11C 16/08* (2013.01); *G11C 2211/5642* (2013.01)

(58) Field of Classification Search
  CPC .................. G11C 7/1087; G11C 16/08; G11C 2211/5642; G11C 5/14; G11C 29/70; G11C 29/83; G11C 11/221; G11C 5/141; G11C 29/702; G11C 29/832; G11C 5/148
  USPC ............................................. 365/201; 714/14
  See application file for complete search history.

(56) References Cited

U.S. PATENT DOCUMENTS 6,603,689 B2 * 8/2003 Kato ................... G11C 29/787
                                                  365/225.7
7,372,750 B2 * 5/2008 Poechmueller ........ G11C 29/44
                                                  365/201

(Continued)

FOREIGN PATENT DOCUMENTS

KR    20090022292 A    3/2009
KR    20150129421 A    11/2015
KR    20160091688 A    8/2016

OTHER PUBLICATIONS

Korean Intellectual Property Office, "Notice of Reasons for Rejection," issued in connection with Korean Patent Application No. 10-2020-0070143, dated May 14, 2021 (5 pages).

(Continued)

*Primary Examiner* — Tha-O H Bui
(74) *Attorney, Agent, or Firm* — Holland & Hart LLP

(57) ABSTRACT

Methods, systems, and devices for efficient power scheme for redundancy are described. A memory device may include circuitry that stores memory address information related to one or more defective or unreliable memory components and that compares memory address information to memory addresses targeted for memory access operations. The memory device may selectively distribute a targeted memory address to one or more circuits within the circuitry based on whether those circuits store memory address information. Additionally or alternatively, the memory device may selectively power one or more circuits within the circuitry based on whether those circuits store memory address information.

12 Claims, 9 Drawing Sheets

(56) References Cited

U.S. PATENT DOCUMENTS 9,343,184 B2 * 5/2016 Wilson ................. G11C 11/418
10,403,390 B1 * 9/2019 Wilson ................. G11C 29/76

OTHER PUBLICATIONS

Korean Patent Office, "Notice of Allowance," issued in connection with Korea Patent Application No. 10-2020-0070143, dated Sep. 2, 2021 (4 pages).

* cited by examiner

EFFICIENT POWER SCHEME FOR REDUNDANCY

BACKGROUND

The following relates generally to a system that includes at least one memory device and more specifically to an efficient power scheme for redundancy.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Some memory devices may increase reliability by tracking memory components (e.g., access lines or memory cells) that have been identified as having problems. But a memory device that uses circuitry relating to identified problems may consume excess power. Techniques for reducing power consumption at a memory device may be desired.

DETAILED DESCRIPTION

Figure 1:
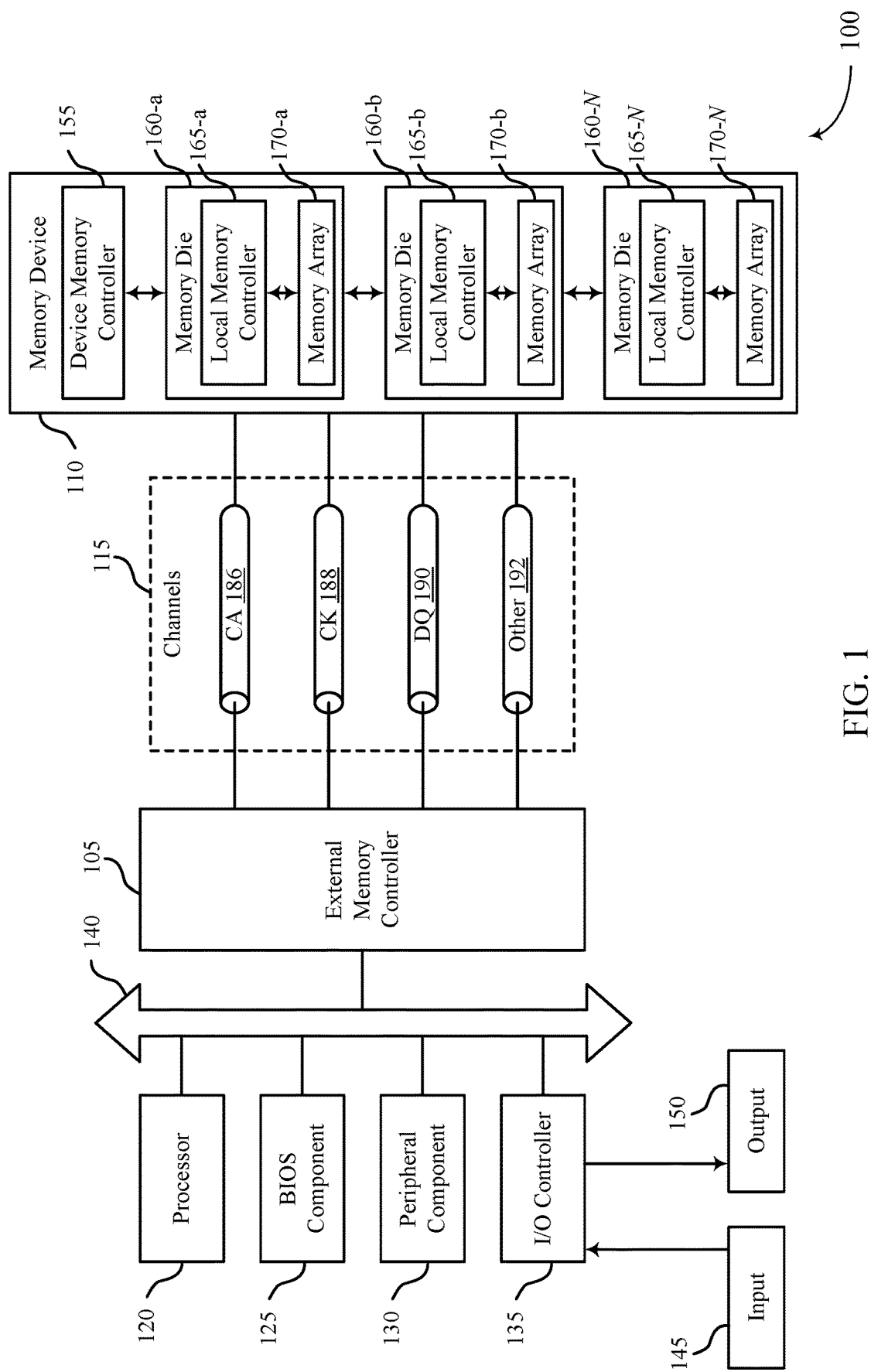
FIG. 1 illustrates an example of a system that supports an efficient power scheme for redundancy in accordance with examples as disclosed herein.

Some memory devices may increase reliability by tracking memory components (e.g., access lines or memory cells) that have been identified as having defective or unreliable. For example, a memory device may include circuitry that stores the addresses of defective memory components and that indicates when one of those addresses is targeted for an upcoming memory access operation. Such an indication may allow the memory device to avoid using the defective memory components, thereby increasing reliability. But some memory device that use such circuitry may consume excess power. The present disclosure describes aspects related to reducing power consumption, among other benefits.

The power consumed by a memory device implementing redundancy may be reduced by selectively distributing memory addresses targeted for memory access operations. For example, a memory device may provide a targeted memory address to one or more components for redundancy but not others. Additionally or alternatively, the memory device may selectively isolate one or more components of the memory device from power when those components are not in use. For example, the memory device may connect to power one or more components for redundancy but not others.

A memory device may implement redundancy to increase the reliability of its operations and data. In a redundancy scheme, a memory device may inventory its memory components (e.g., access lines, memory cells, etc.) and identify defective or unreliable components. The memory device may store the addresses of the defective or unreliable components so that when the defective or unreliable components are targeted for a memory operation, the device can detect as much and use different (e.g., non-defective, reliable) components instead.

To accomplish this, the addresses of defective or unreliable memory components may be stored in one or more circuits called repair solutions or repair circuits. There may be one or more (e.g., many) repair circuits for a given region of memory, and at least some if not each repair circuit may include one or more latches for storing the addresses of defective memory components. When a memory device targets a memory component for an access operation, the memory device may determine whether the memory component is defective by comparing its address to the addresses stored by the repair circuits. Because the device does not know which repair circuit, if any, stores the address matching that of the targeted memory component, the device may provide the targeted memory address to every repair circuit for comparison. But providing the targeted memory address to every repair circuit may waste power because not every repair circuit may be in use (e.g., currently storing a memory address).

According to the techniques described herein, a memory device may conserve power by selectively providing a targeted memory address to one or more sets of repair circuits that have least one repair circuit that is in use. Thus, the memory device may avoid providing the targeted memory address to one or more sets of repair circuits that are not in use, which saves power, among other benefits. Additionally or alternatively, the memory device may conserve power by selectively powering down latches that are not in use (e.g., storing addresses for defective memory components).

Features of the disclosure are initially described in the context of a memory system and memory die as described with reference to FIGS. 1-3. Features of the disclosure are described in the context of redundancy circuitry as described with reference to FIGS. 3-7. These and other features of the disclosure are further illustrated by and described with reference to a memory controller diagram and flowcharts that relate to an efficient power scheme for redundancy as described with references to FIGS. 8-10.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, switching components, latches, logic components, or other active or passive elements, configured to carry out the functions described herein.

The memory device 110 may include a device memory controller 155 and one or more memory dice 160. At least some if not each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another or next to one another. In some cases, a memory die 160 may divided into regions or areas of memory. For example, a memory die 160 may include one or more memory banks, at least some of which if not each of which may be associated with respective redundancy circuitry.

In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120. In some examples, a local memory controller 165 may control redundancy circuitry for one or more regions of memory within the associated memory array 170.

The external memory controller 105 may be configured to enable communication of information, data, and/or commands between components of the system 100 (e.g., the processor 120) and the memory device 110. For example, when a memory address is targeted for an access operation, the external memory controller 105 may facilitate communication of the targeted memory address to other components of system 100. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., PAM3 signal or PAM4 signal) signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, the system 100 may include redundancy circuitry that stores memory address information. The memory address information may be transferred (e.g., autonomously sent) from fuse circuits ("fuses") that store information related to the characteristics of the system 100. The memory address information may include memory addresses that are associated with memory components (e.g., access lines or memory cells) that have been identified as unusable or having issues. For example, a memory component may be identified as defective or unreliable. A defective memory component may be a component that does not operate properly. An unreliable memory component may be one that behaves inconsistently. In some cases, a component may be both defective and unreliable. For ease of reference in the present disclosure, one type of memory component (e.g., unreliable or defective) may be referred to in certain examples, however, applicability of the related concepts may be equal (e.g., the same) for both types unless otherwise explicitly indicated.

When a memory address is selected for an access operation, redundancy circuitry may compare the selected memory address to one or more memory addresses stored by circuits within the redundancy circuitry. If a selected memory address matches a memory address stored by at least one of the circuits, the redundancy circuitry may send a signal indicating as much to one or more other components of system 100. Once informed that the selected memory address is defective or unreliable, the system 100 or one or more components of the system 100 may take steps to avoid using that memory address.

In general, redundancy circuitry may distribute the selected memory address (or a representation of the memory address) to all circuits within the redundancy circuitry, which may be continually powered while the system 100 is in operation. But providing one or more memory addresses to, and powering, all circuits within the redundancy circuitry may waste power when only some of the circuits are in use (e.g., storing defective memory addresses). According to the techniques described herein, redundancy circuitry may reduce power consumption of a system 100 by selectively powering, and distributing selected memory addresses to, circuits that are in use.

Figure 2:
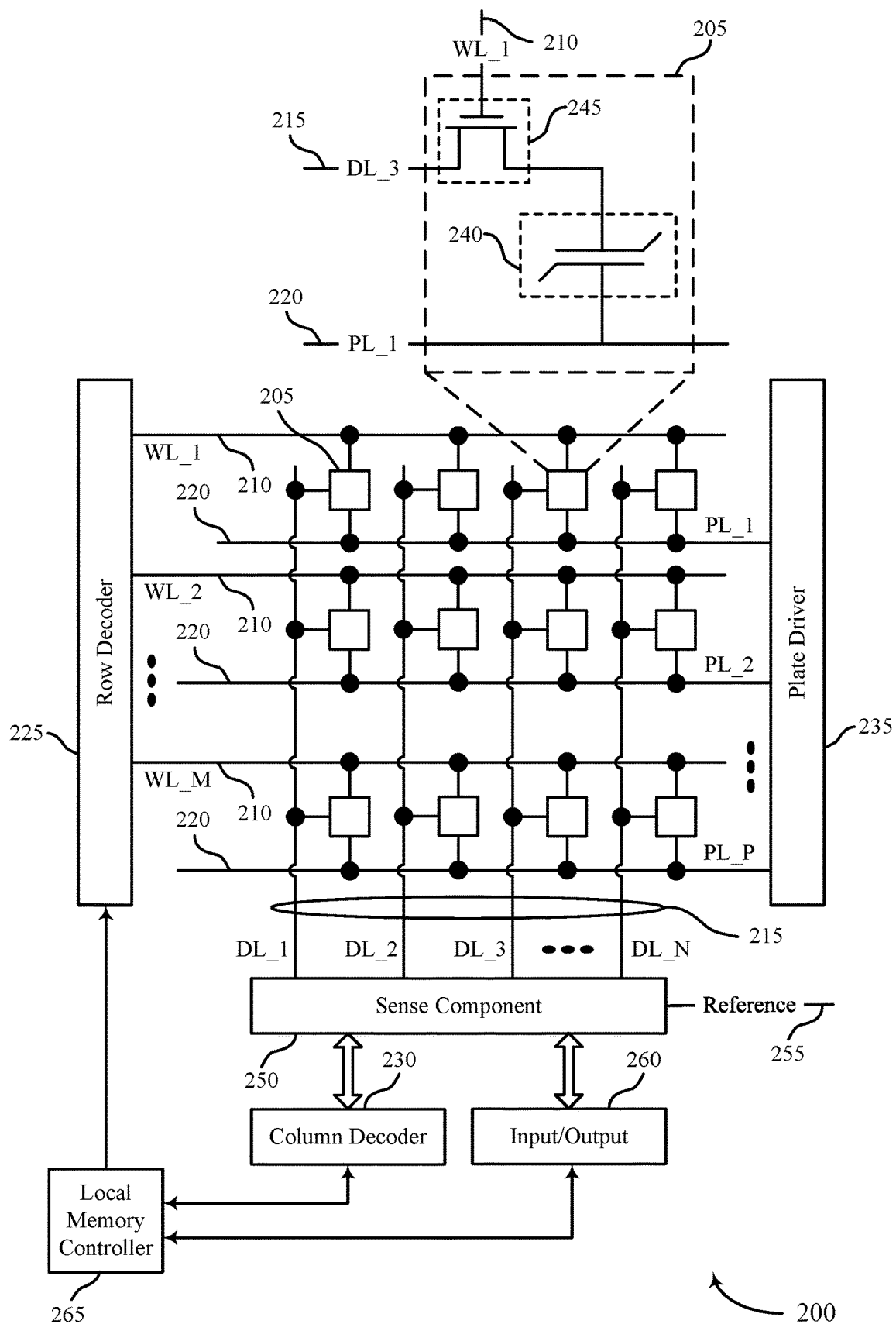
FIG. 2 illustrates an example of a memory die that supports an efficient power scheme for redundancy in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state. The techniques described herein can be implemented using any type of memory architecture, including FeRAM and DRAM architecture.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205. The address of a word line 210, plate line 220, or digit line 215 may be referred to herein as an access line address.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage).

The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

Before performing an access operation, such a read or write operation, the local memory controller 265 may check to see if the targeted memory address is defective or unreliable. For example, the local memory controller 265 may provide the targeted memory address to redundancy circuitry which may return a match signal if the memory address is defective. According to the techniques described herein, the redundancy circuitry may implement an efficient power scheme by selectively distributing the targeted memory address to certain groups of its repair circuits based on the use status of those repair circuits. Additionally or alternatively, the redundancy circuitry may also selectively isolate certain groups of repair circuits from power based on the use status of those repair circuits.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
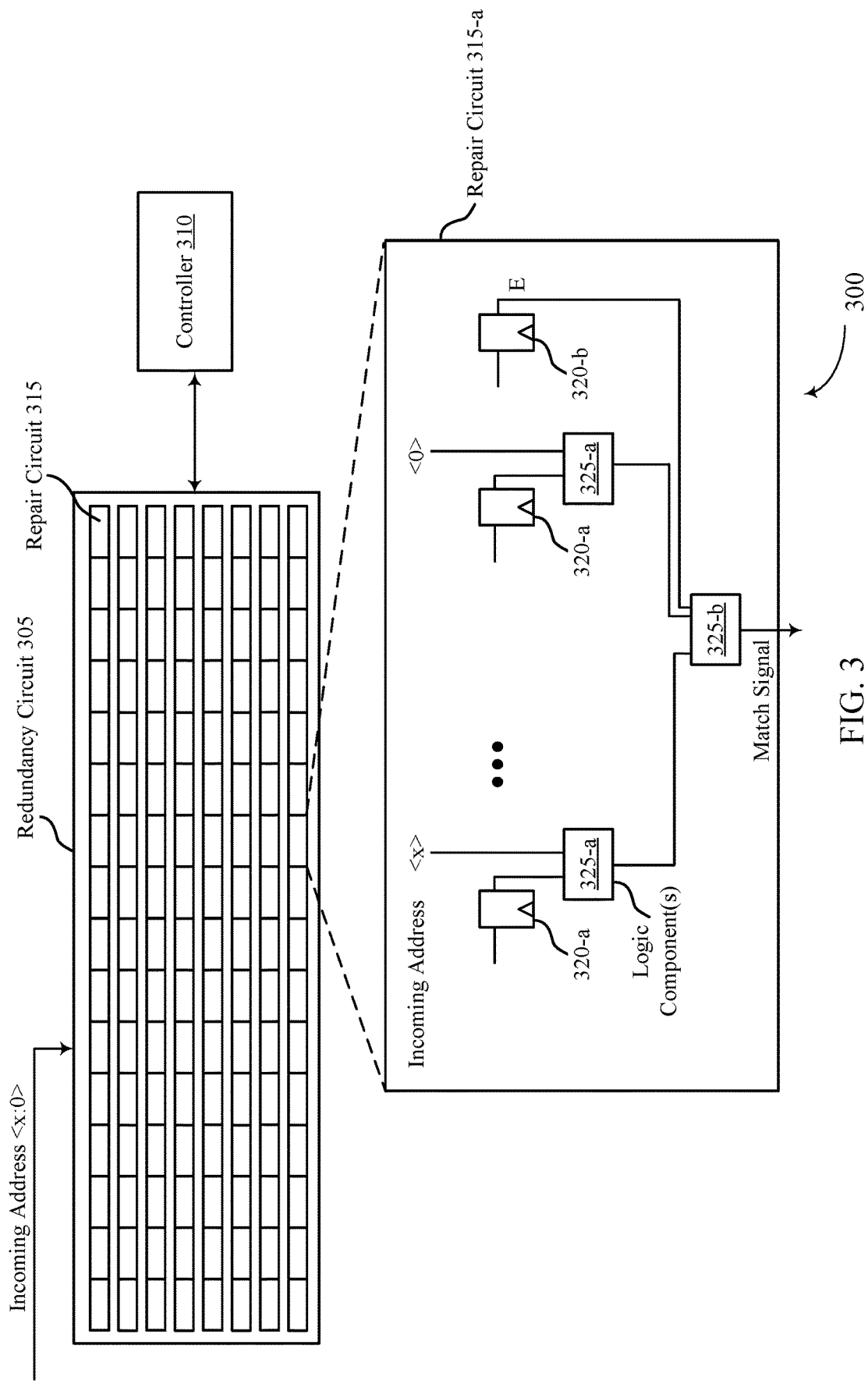
FIGS. 3 through 7 illustrate examples of circuitry that supports an efficient power scheme for redundancy in accordance with examples as disclosed herein.

FIG. 3 illustrates an example of circuitry 300 that supports an efficient power scheme for redundancy in accordance with examples as disclosed herein. Circuitry 300 may include a redundancy circuit 305 and a controller 310, which may be coupled with each other. The controller 310 may control various components of redundancy circuit 305.

Redundancy circuit 305 may be associated with (e.g., store addresses for) a region of memory, such as memory bank, as described herein. Redundancy circuit 305 may include one or more repair circuits 315, which may also be referred to as repair solutions. In one example, redundancy circuit 305 may include 128 repair circuits as shown in FIG. 3. A repair circuit 315 may be configured to store memory address information. For example, a repair circuit 315 may store one or more addresses that correspond to one or more memory components (e.g., an access line or memory cell) that have been identified as corrupted, defective, unreliable, or otherwise un-usable. Thus, redundancy circuit 305 may have the capacity to store the addresses of 128 memory components in some examples. The one or more addresses stored at a repair circuit 315 may be obtained from one or more fuses (e.g., upon start-up or reset).

The redundancy circuit 305 may determine when a defective memory component is targeted for a memory access operation and provide an indication of the determination to a memory controller (e.g., controller 310) or other component. For example, redundancy circuit 305 may receive an incoming address (IA) (e.g., from a memory controller such as controller 310) that corresponds to a memory component that has been targeted (e.g., selected) for a memory access operation. The incoming address may be include x+1 bits and may represent a targeted memory address or a complemented version of a targeted memory address that has inverted (e.g., flipped) bits.

The incoming address may be distributed to at least some if not each of the repair circuits 315 for comparison. A repair circuit 315 may perform one or more logic operations on the incoming address and an address stored by the repair circuit 315 to compare the incoming address and the stored address. For example, repair circuit 315 may perform one or more logic operations on the incoming address and an address stored by the repair circuit 315 to determine whether the incoming address and the stored address match (e.g., are the same). If the addresses match, the repair circuit 315 may output a signal indicative of the match to an external component or device (e.g., a memory controller such as controller 310).

For example, the repair circuit 315 may assert the match signal. If the addresses are different, the redundancy circuit 305 may output no signal (e.g., may refrain from outputting a related signal) or a signal indicative of the difference to the external component or device. Such indications may inform a memory device when it has targeted defective memory components for operations, and thus may enable the memory device to avoid using those memory components.

For example, instead of accessing the defective memory component, the memory device access a spare (or "redundancy") memory component that corresponds to the repair circuit 315 that asserted the match signal.

To perform its functions, at least some if not each repair circuit 315 may include multiple (e.g., x+1) latches 320 and logic components 325. A latch 320-*a* may be configured to store memory information, such as an address bit. The address bit may be part of a memory address associated with a memory component that has been identified as defective or unreliable. Thus, a repair circuit 315 may store a complete memory address by using multiple latches at least some if not each of which stores a respective bit. The memory address stored by a repair circuit 315 may be unique relative to other memory addresses stored at the redundancy circuit 305. For example, a first repair circuit 315 may include a first set of latches configured to store a first memory address and a second repair circuit 315 may include a second set of latches configured to store a second memory address.

A latch 320-*a* may be configured to output (e.g., in response to a prompt or command by a memory controller, such as controller 310) a signal indicative of the address bit stored at that latch 320-*a*. The signal may be output (e.g., provided) to one or more logic component(s) 325-*a* coupled with the latch 320-*a*. For example, the signal may be conveyed by a conductive path that couples an output of the latch 320-*a* with an input of the logic component(s) 325-*a*.

In addition to receiving the stored address bit from the latch 320-*a*, the logic component(s) 325-*a* may also receive a corresponding incoming address bit (e.g., from controller 310). The logic component(s) 325-*a* may perform one or more logic operations on the received bit signals and output the result of the logic operations to another logic component 325-*b*. Although shown with two inputs, a logic component 325-*a* may include a different number of inputs, such as having additional inputs. For example, the logic component 325-*a* may include four inputs. In such cases, the logic component 325-*a* may also receive complemented versions of the stored and incoming address bits.

The logic component 325-*b* may perform a logic operation on signals received from logic components 325-*a* and latch 320-*b*. The latch 320-*b* may store information about the content stored by the other latches 320-*a*. For example, the latch 320-*b* may store a bit that indicates whether the content stored by the latches 320-*a* is memory address information. Thus, the bit may indicate the use status of the repair circuit 315-*a*. The bit stored by latch 320-*b* may be referred to herein as the "use" bit, "status" bit, or "enable" bit, and may be denoted as the "E" in the figures. The enable bit may prevent the repair circuit 315 from incorrectly asserting the match signal when a targeted address coincidentally matches random content stored by the latches 320-*a*. Thus, the logic component 325-*b* may assert the match signal when the enable bit is asserted and the targeted address matches the stored address.

The foregoing explains the functionality of a single repair circuit 315. But as noted, an incoming address may be provided to multiple if not every repair circuit 315 within the redundancy circuit 305 to ensure that the incoming address is compared to at least some if not all the addresses stored in the redundancy circuit 305. However, only a fraction of the repair circuits 315 may store addresses (e.g., the remaining repair circuits 315 may store random content that is different than memory address information). In these cases, distributing the incoming address to every repair circuit 315 may waste power. This is because distributing the incoming address may involve charging multiple traces or wires per repair circuit 315.

In some cases, distributing the incoming address may increase the peak power consumed by a memory device. If an incoming address and its complement are distributed to every repair circuit 315 over a relatively short period of time (e.g., 1 ns), the charging associated with the distribution can result in a large (e.g., 165 mA) alternating current (AC) power spike. This power spike may in turn contribute to the average power consumed by the memory device (e.g., the power consumed given y access operations over a period of time). So, providing the incoming address to every repair circuit 315 may burden the host device's battery.

According to the techniques described here, the peak and average power consumed by a memory device implementing redundancy may be reduced by selectively distributing the incoming address to groups of repair circuits 315 that have at least one repair circuit 315 in use. Thus, the memory device may avoid distributing the incoming address to groups of repair circuits 315 that are not in use, which may conserve power.

But peak and average power may not be the only issues or power issues related to redundancy. A memory device may also waste power by powering latches that are not in use (e.g., storing a memory address). Because powering a latch also results in leakage, the power costs of powering unused latches may be two-fold. According to the techniques described herein, a memory device implementing redundancy may reduce power consumption and leakage by selectively powering-down unused latches within repair circuits 315.

Figure 4:
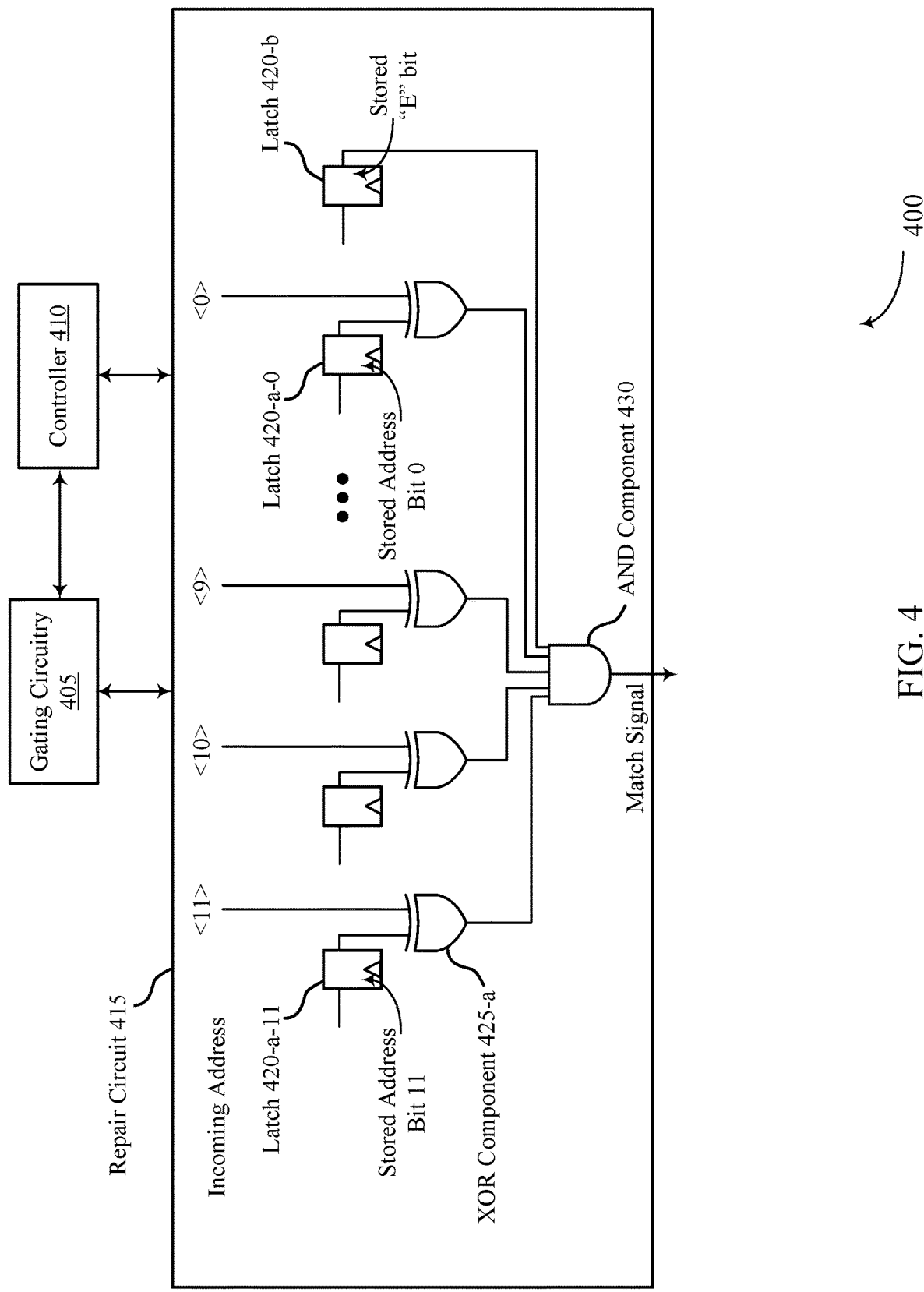

FIG. 4 illustrates an example of circuitry 400 that supports an efficient power scheme for redundancy in accordance with examples as disclosed herein. Circuitry 400 may include gating circuitry 405, controller 410, and repair circuit 415, at least some if not each of which may be coupled with the other. Controller 410 may be an example of a controller 310 as described with reference to FIG. 3, and repair circuit 415 may be an example of a repair circuit 315 as described with reference to FIG. 3. Repair circuit 415 may store the address of an unreliable or defective memory component and indicate when that address is targeted for a memory operation. Gating circuitry 405 may selectively provide incoming addresses to the repair circuit 415 based on the use status of the repair circuit 415. Controller 410 may control various signals and components used by gating circuitry 405 and repair circuit 415.

Repair circuit 415 may include multiple latches and logic components, such as XOR components and AND component(s). The latches 420-*a* may be examples of latches 320-*a* as described with reference to FIG. 3, and the latch 420-*b* may be an example of the latch 320-*b* as described with reference to FIG. 3. The XOR components 425 and AND component 430 may be examples of logic components 325 as described with reference to FIG. 3. The latches 420-*a* and the XOR components 425 may be coupled with (e.g., in electronic communication with) one another. In this example, repair circuit 415 may include thirteen latches 420 and twelve XOR components 425. Thus, repair circuit 415 may have one more latch 420 than XOR components 425.

At least some if not each latch 420-*a* may be configured to store memory address content. For example, each latch 420-*a* may be configured to store at least one bit (e.g., a single bit, multiple bits) of a memory address associated with a memory component identified as defective or unreliable. Collectively, the latches 420-*a* may store one complete memory address (e.g., a memory address of an unreliable or defective access line or memory cell). For example, latch 420-a-11 may store the twelfth bit (bit 11) of a 12-bit address and latch 420-a-0 may store the first bit (bit 0) of the 12-bit address. The bit stored at a latch 420-a may be downloaded from a fuse, e.g., upon power-up or reset. If a repair circuit 415 does not receive an address bit from a fuse, the repair circuit 415 may be referred to as unused and the content stored by the repair circuit 415 may be random content (e.g., different than memory address content).

In addition to the latches 420-a that store address bits, repair circuit 415 may include a latch that stores an enable bit. For example, the repair circuit 415 may include latch 420-b, which may store the enable bit for repair circuit 415. The enable bit may indicate when the other latches 420-a store memory address bits (as opposed to random bits). Such an indication may prevent the repair circuit 415 from asserting the match signal when a targeted address coincidentally matches with the random bits stored by unused latches 420-a. Thus, the enable bit may allow the repair circuit 415 to differentiate between valid and invalid matches. The enable bit may be labeled as the "E" bit and may alternatively be referred to as the use bit or status bit.

At least some if not each XOR component 425 may be coupled with an output of a corresponding latch 420-a. The XOR component 425 may receive a signal representing an incoming address bit from an external component. As noted, the incoming address bit may be a bit (or complemented version of a bit) of a memory address targeted for an access operation.

In the example shown in FIG. 4, the incoming address bits may be complemented versions of the targeted memory address bits. The XOR component 425 may also receive a signal representing the address bit stored at the latch 420-a that is coupled with the XOR component 425. For example, XOR component 425-a may receive a signal representing the twelfth bit of the stored address (bit 11) from latch 420-a-11 and a signal representing the twelfth incoming address bit (denoted <11> in FIG. 4).

The XOR component 425 may perform a logic operation (e.g., a bit-wise comparison) on the received signals and output the result. For example, XOR component 425 may output a logic zero if the input signals represent the same bits and a logic one if input signals represent different bits. Thus, an XOR component 425 may output a logic zero if the stored bit matches the incoming bit and a logic one if the stored bit does not match the incoming bit. A logic one may be represented by a signal with a first threshold voltage and a logic zero may be represented by a signal with a second threshold voltage.

The output of at least some if not each XOR component 425 may be transferred to the AND component 430. The AND component 430 may perform a logic operation (e.g., an AND operation) on its inputs and output the result. For example, the AND component 430 may output a logic one (e.g., the match signal) if all of its inputs are logic ones. Put another way, the AND component 430 may output (or "assert") the match signal if the address selected for the memory access operation matches the address stored by the repair circuit 415.

Thus, repair circuit 415 may operate on an incoming address to determine if a targeted address is defective or unreliable. But in some cases, the content stored by repair circuit 415 may be different than memory address information. In these cases, providing the incoming address to the repair circuit 415 may waste power. According to the techniques described herein, the incoming address may be provided to the repair circuit 415 if the repair circuit 415 is in use but may be withheld if the repair circuit 415 is not in use.

For example, the gating circuitry 405 may receive the incoming address and distribute it to repair circuit 415 if the enable bit is asserted. If the enable bit is not asserted, the gating circuitry 405 may output a static signal to the repair circuit 415. Thus, the gating circuitry 405 may selectively provide the incoming address to repair circuit 415 based on the use status of the repair circuit 415.

Although shown with two inputs, an XOR component 425 may include additional inputs. For example, an XOR component 425 may include four inputs. In such cases, the XOR component 425 may also receive complemented versions of the incoming address bit and the stored address bit.

Although shown with XOR logic gates and an AND logic gate, repair circuit 415 can be implemented using any type or combination of logic components, including OR logic gates, XOR logic gates, NAND logic gates, NOT gates (also referred to as inverters), XNOR logic gates, etc. For example, repair circuit 415 can be implemented using XNOR logic gates by using an incoming address that represents the targeted address, rather than a complemented version of the targeted address.

Figure 5:
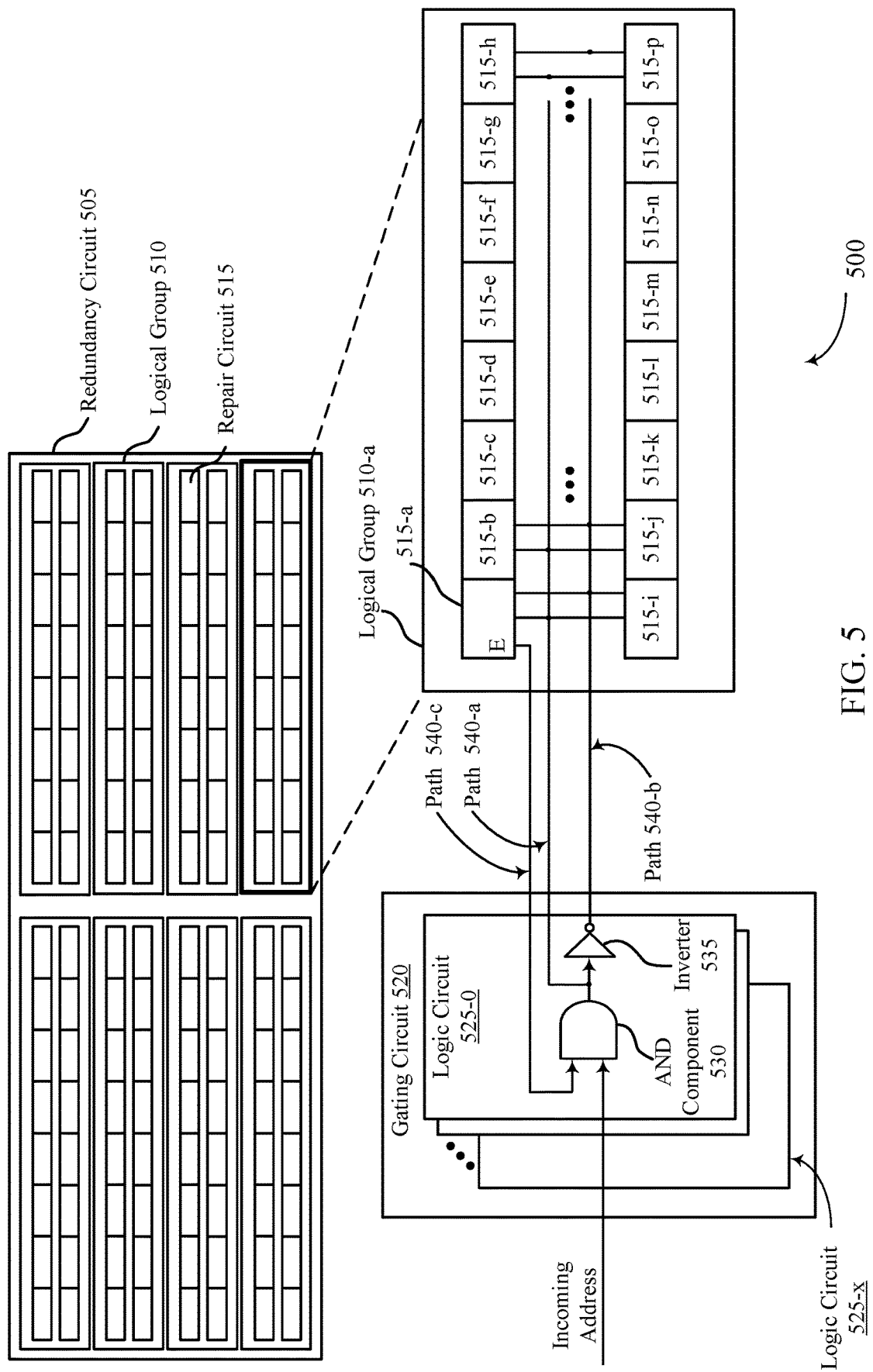

FIG. 5 illustrates an example of circuitry 500 that supports an efficient power scheme for redundancy in accordance with examples as disclosed herein. Circuitry 500 may include redundancy circuit 505 and gating circuit 520. Redundancy circuit 505 may be an example of a redundancy circuit 305 as described with reference to FIG. 3 and gating circuit 520 may be an example of circuitry included in gating circuitry 405 as described with reference to FIG. 4. Redundancy circuit 505 may include repair circuits 515 that are grouped into multiple logical groups 510. For example, the repair circuits 515 may be divided into eight logical groups 510 that each include sixteen repair circuits 515. At least some if not each logical group 510 may be coupled with a respective gating circuit 520 that selectively distributes an incoming address to repair circuits 515 within that logical group 510. Such selective distribution may reduce the peak and average power consumed by the circuitry 500.

Gating circuit 520 may include multiple logic circuits 525. The quantity of logic circuits 525 may be equal to the quantity of bits making up an incoming address. Thus, there may be one logic circuit 525 per address bit. At least some if not each logic circuit 525 may receive a respective bit of the incoming address. For example, logic circuit 525-0 may receive a signal representing the first bit (bit 0) of the incoming address and logic circuit 525-x may receive a signal representing the xth bit (e.g., bit x−1) of the incoming address. Additionally, at least some if not each logic circuit 525 may receive a signal representing the enable bit of the repair circuit 515 that is coupled with an input of the gating circuit 520. For example, logic circuit 525-0 may receive the enable bit from repair circuit 515-a. At least some if not each logic circuit 525 may include one or more logic components.

A logic circuit 525 may distribute an incoming address bit to the repair circuits 515 in its corresponding logical group 510 if at least one of the repair circuits 515 is in use. For example, logic circuit 525-0 may distribute an incoming address bit to the repair circuits 515-a through 515-p if the enable bit from repair circuit 515-a is asserted. In addition to distributing the incoming address bit, a logic circuit 525 may also distribute the complement (e.g., an inverted version) of the incoming address bit. However, a logic circuit 525 may withhold an incoming address bit from its corresponding logical group 510 if none of the repair circuits 515 are in use. For example, logic circuit 525-0 may withhold an incoming address bit from the repair circuits 515-a through 515-p if the enable bit from repair circuit 515-a is not asserted.

For clarity, the operations of a logic circuit 525 are explained in the context of logic circuit 525-0. However, other components, configurations, and operations of a logic circuit 525 are contemplated and fall within the scope of the present disclosure. For instance, a logic circuit 525 may not include an inverter 535 (e.g., when a logic component 325-a, as described with reference to FIG. 3, has two inputs instead of four).

Logic circuit 525-a may include an AND component 530 and an inverter 535. The AND component 530 and inverter 535 may be coupled with each other. For example, an output of the AND component 530 may be coupled with an input of the inverter 535. The AND component 530 and inverter 535 may also be coupled with the repair circuits 515 in logical group 510-a.

For example, the output of AND component 530 may be coupled with a first input of repair circuit 515-a (e.g., via conductive path 540-a) and the output of inverter 535 may be coupled with a second input of repair circuit 515-a (e.g., via conductive path 540-b). Various conductive paths may couple other components in circuitry 500. For example, conductive path 540-c may couple the output of a latch storing the enable bit to an input of the AND component 530. A conductive path may be a combination of elements (e.g., traces and/or components) that allows current to flow uninterrupted from one end of the conductive path to another. For example, a conductive path may include one or more switching components that are disposed along a trace and that are activated to allow current flow.

As noted, the logic components of logic circuit 525-0 may be configured to selectively distribute an incoming address bit to logical group 510-a based on the enable bit stored at repair circuit 515-a. In one example, the AND component 530 may receive a signal representing the enable bit stored at repair circuit 515-a. The AND component 530 may also receive a signal representing an incoming address bit. The AND component 530 may perform a logic operation (e.g., an AND operation) on the enable bit and the incoming address bit and output the result.

When the enable bit is asserted (e.g., is a logic one), the AND component 530 may output the incoming address. When the enable bit is not asserted (e.g., is a logic zero), the AND component 530 may output a logic zero. Thus, the incoming address bit may be provided (e.g., signaled) to the repair circuits 515-a through-515-p when at least one of those repair circuits 515 is in use, but not when all of the repair circuits 515 are unused. Such selective distribution may save power by preventing the needless charging of conductive lines leading to unused repair circuits 515.

In some cases (e.g., when a logic component 325-a, as described with reference to FIG. 3, has four inputs instead of two), the logic circuit 525-0 may also distribute the complemented version of the incoming address bit to the logical group 510-a. For example, when the enable bit is asserted, the inverter 535 may invert the incoming address bit output by the AND component 530 and send the resulting complemented version to the repair circuits 515 in logical group 510-a.

Thus, an incoming address bit (and/or its complement) may be distributed to a logical group 510-a based on the use status of the logical group. The address bits making up the rest of the targeted memory address may undergo similar operations and thus may be distributed on a similar basis. In some examples, the incoming address bits may be distributed in parallel (e.g., simultaneously, or within a threshold duration of time) to reduce latency. Once the repair circuits 515 receive all the address bits of a targeted memory address, the repair circuits 515 may perform logic operations (e.g., bit-wise comparisons) to detect whether the targeted memory address matches any of the stored memory addresses identified as defective.

To ensure that an incoming address is not accidentally withheld from an in-use repair circuit 515, the defective addresses stored by redundancy circuit 505 may be loaded into the repair circuits 515 in a particular order, rather than randomly. For example, the first defective address stored at logical group 510 may be stored at the repair circuit 515 that is coupled with an input of the gating circuit 520. Thus, a defective address may be stored at repair circuit 515-a before any other defective addresses are stored at other repair circuits 515 within logical group 510-a. Such ordering may ensure that any and all repair circuits 515 storing memory addresses receive the incoming address for comparison. In some cases, the storage of defective addresses may be further ordered so that power consumption is reduced. For instance, after storing a defective address at repair circuit 515-a, the host device may opt to store the next fifteen addresses at the other repair circuits in logical group 510-a, as opposed to repair circuits 515 in other logical groups 510. Thus, an incoming address may only be distributed to one logical group (as opposed to several, which might be the case if the defective addresses were stored at random or indiscriminately).

Figure 6:
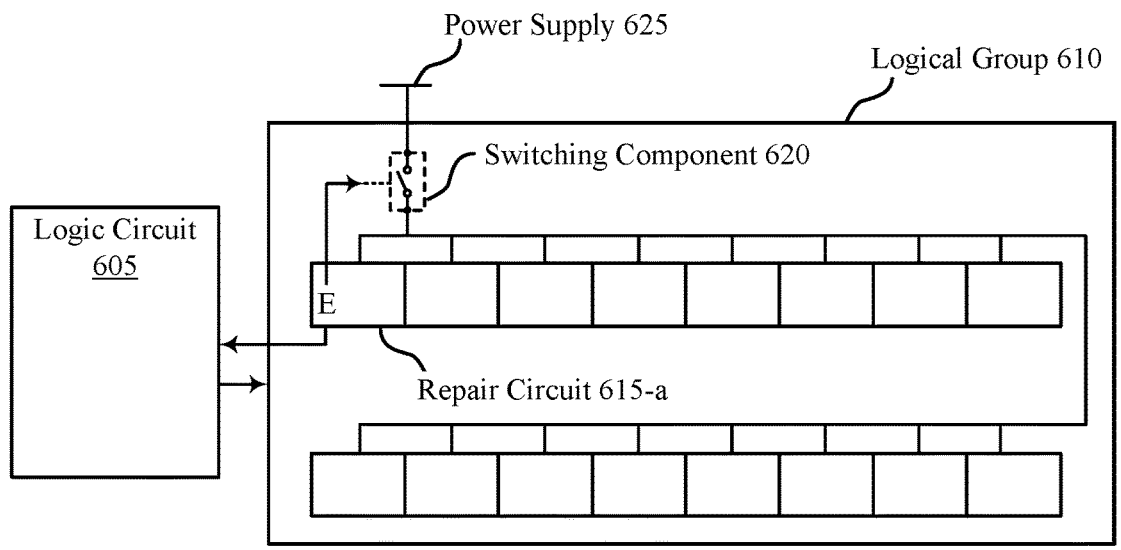

FIG. 6 illustrates an example of circuitry 600 that supports an efficient power scheme for redundancy in accordance with examples as disclosed herein. Circuitry 600 may be configured to provide power to a logical group if at least one of the repair circuits in the group is in use, and to remove power from the logical group if none of the repair circuits are in use.

Circuitry 600 may include logic circuit 605 and logical group 610, which may be examples of a logic circuit 525 and logical group 510, respectively, as described with reference to FIG. 5. Circuitry 600 may also include power supply 625, which may be a local power supply that is powered by a global power supply. Power supply 625 may also be referred to as a power source, voltage source, or current source. Although shown coupled with logic circuit 605, the logical group 610 may be implemented independent of logic circuit 605.

Logical group 610 may include multiple repair circuits 615 and a switching component 620. At least some if not each repair circuit 615 may include a set of latches and may be coupled with the switching component 620. The switching component 620 may be configured to selectively provide power to the repair circuits 615 based on the use status of repair circuit 615-a. Such selectivity may reduce the power consumed and leaked by the circuitry 600.

The switching component 620 may be coupled with the power supply 625 and the latch that stores the enable bit within repair circuit 615-a. For example, an input of the switching component 620 may be coupled with an output of the latch. The switching component 620 may be configured to modify its state (e.g., activate or deactivate) based on the enable bit.

For example, the switching component 620 may receive a signal representing the enable bit from repair circuit 615-a. If the enable bit is asserted, the switching component 620 may activate, thereby establishing a conductive path between the power supply and 625 and the repair circuits 615. If the enable bit is not asserted, the switching component 620 may deactivate, thereby isolating the power supply 625 from the repair circuits 615. Because powering unused repair circuits 615 may be an unnecessary expenditure of power that is exacerbated by leakage, powering-down the unused repair circuits 615 may reduce power consumption of circuitry 600.

The circuitry 600 may be configured to supply the latch storing the enable bit in repair circuit 615-a independent of the enable bit. Such a configuration may allow the circuitry 600 to control the power supplied to the rest of the logical group 610 even when the enable bit is not asserted.

Figure 7:
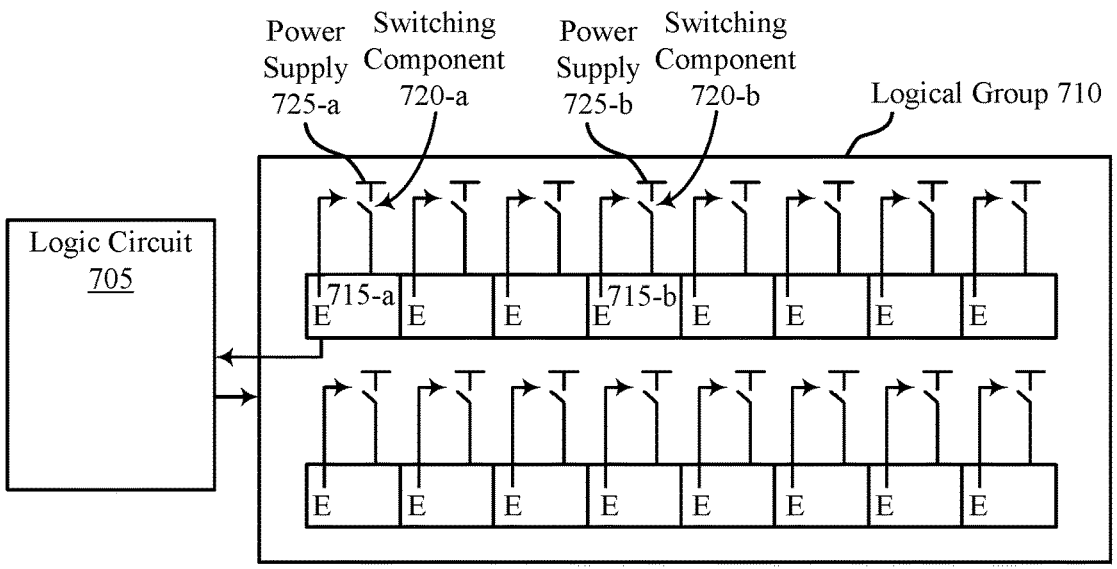

FIG. 7 illustrates an example of circuitry 700 that supports an efficient power scheme for redundancy in accordance with examples as disclosed herein. Circuitry 700 may be configured to provide power on a repair circuit-basis, as opposed to the logical grouping-basis described with reference to FIG. 6. Such a configuration may enable the circuitry 700 to selectively provide power with more granularity compared to circuitry 600, which may increase power savings. However, the configuration of circuitry 700 may have a larger footprint compared that of the configuration of circuitry 600.

Circuitry 700 may include logic circuit 705 and logical group 710, which be examples of a logic circuit and logical group, respectively, as described with reference to FIGS. 5 and 6. Circuitry 700 may also include multiple one or more power supplies 725. The logical group 710 may include multiple repair circuits 715, at least some if not each of which may be coupled with a respective switching component 720.

At least some if not each switching component 720 may be configured to selectively provide power to its corresponding repair circuit 715 based on the use status of that repair circuit 715 (and independent of the use status of other repair circuits 715). For example, switching component 720-a may be configured to activate when the enable bit stored at repair circuit 715-a is asserted and deactivate when the enable bit is not asserted. Accordingly, switching component 720-a may establish a conductive path from power supply 725-a to repair circuit 715-a when repair circuit 715-a is in use, and switching component 720-a may isolate the power supply 725-a from the repair circuit 715-a when the repair circuit 715-b is not in use. Activating and deactivating switching component 720-a may be independent of the enable bits stored at other repair circuits 715.

Similarly, switching component 720-b may be configured to activate when the enable bit stored at repair circuit 715-b is asserted and deactivate when the enable bit is not asserted. Accordingly, switching component 720-b may establish a conductive path from power supply 725-b to repair circuit 715-b when repair circuit 715-b is in use, and switching component 720-b may isolate power supply 725-b from the repair circuit 715-b when the repair circuit 715-b is not in use. Activating and deactivating switching component 720-b may be independent of the enable bits stored at other repair circuits 715.

The circuitry 700 may be configured to supply power to the latch storing the enable bit in each repair circuit 715 independent of that respective enable bit. Such a configuration may allow the circuitry 700 to control the power supplied to each repair circuit 715 even when the enable bit stored at repair circuit 715 is not asserted.

Although shown with multiple power supplies 725, the power gating techniques described herein can be implemented using a single power supply 725 that is coupled with each of the switching components 720.

Figure 8:
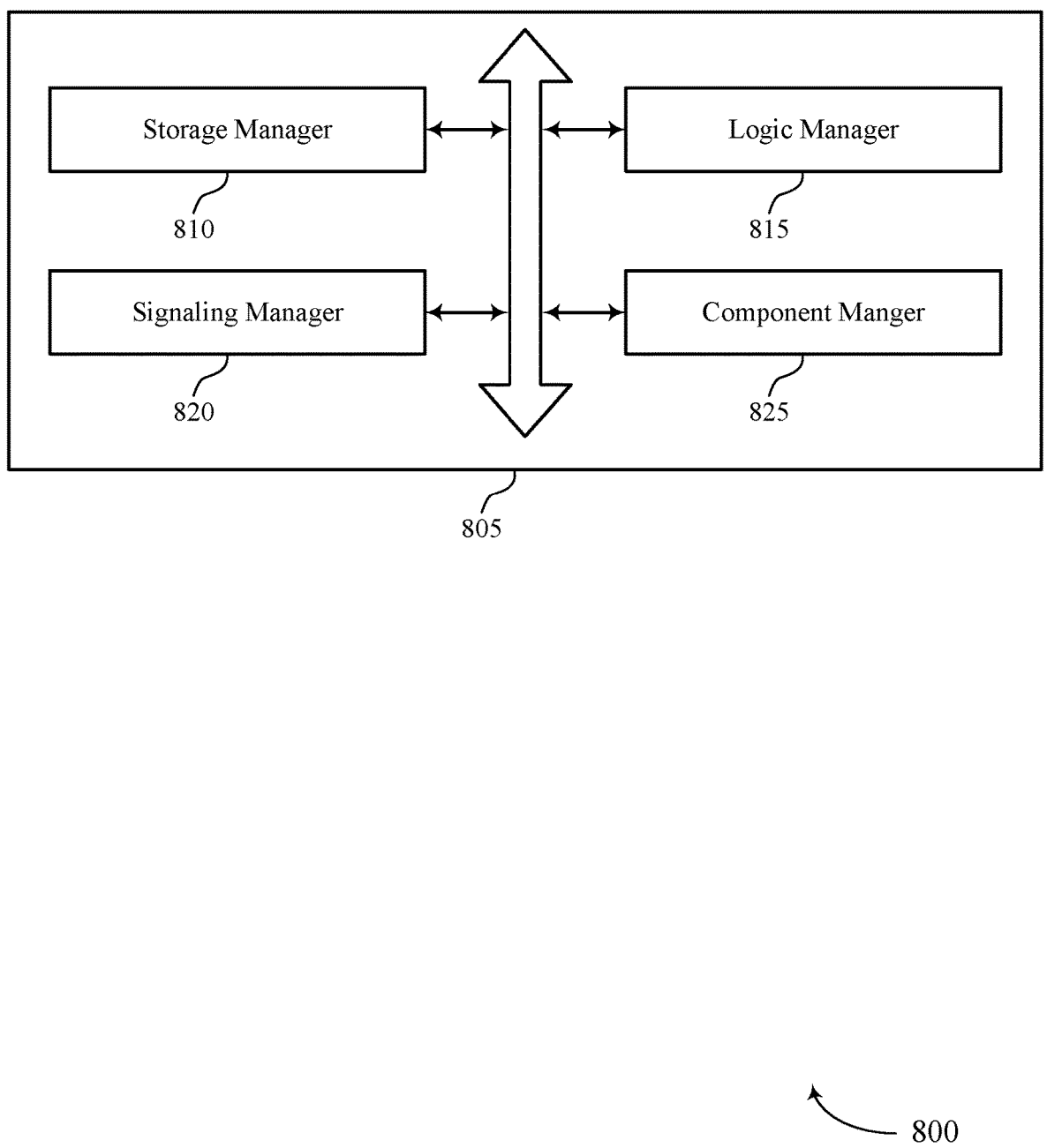
FIG. 8 shows a block diagram of a device that supports an efficient power scheme for redundancy in accordance with examples as disclosed herein.

FIG. 8 shows a block diagram 800 of a memory controller 805 that supports an efficient power scheme for redundancy in accordance with examples as disclosed herein. The memory controller 805 may be an example of a memory controller as described with reference to FIGS. 1-4. The memory controller 805 may include a storage manager 810, a logic manager 815, a signaling manager 820, and a component manager 825. Each of these modules may communicate, directly or indirectly, with one another (e.g., via one or more buses). The modules of memory controller 805 may perform, or instruct other components to perform, various operations that enable the efficient power schemes described herein.

For example, the modules may be configured to facilitate operations for the efficient power scheme described with reference to FIG. 5. In such an example, the storage manager 810 may cause or instruct one or more components to store, at a first latch, a first address bit associated with a memory component identified as unreliable. The storage manager 810 may also cause or instruct one or more components to store, at a second latch, an one enable bit that indicates the first latch is storing the first address bit. The logic manager 815 may cause or instruct one or more components to perform a logic operation on signals representing the enable bit and a second address bit that is associated with a memory component selected for a memory access operation. The signaling manager 820 may cause or instruct one or more components to output a signal representing the second address bit to a logic component coupled with the first latch based at least in part on the logic operation.

In some cases, the logic manager 815 may cause or instruct the logic component to perform a second logic operation on signals representing the first and second address bits. In such cases, the signaling manager 820 may cause or instruct one or more components to output a second signal based at least in part on the second logic operation. In some cases, the logic manager 815 may cause or instruct a second logic component to perform a third logic operation on the second signal output by the logic component and a third signal representing the enable bit. In such cases, the signaling manager 820 may cause or instruct one or more components to output a fourth signal indicating whether the first address bit matches the second address bit based at least in part on the third logic operation.

In some cases, the signaling manager 820 may cause or instruct a second logic component to receive a signal representing the enable bit from the second latch. In such cases, the signaling manager 820 may cause or instruct the second logic component to receive a signal representing the at least one second address bit, where the logic component performs the logic operation.

In some examples, the logic manager 815 may cause or instruct one or more components to invert the second address bit after performing the logic operation. In such cases, the signaling manager 820 may cause or instruct one or more components to signal the at least one inverted second address bit to the logic component coupled with the first latch. Also, the logic manager 815 may cause or instruct one or more components to perform a second logic operation on signals representing the first address bit, the second address bit, and the inverted second address bit.

In some cases, the modules may be configured to facilitate operations for the efficient power scheme described with reference to FIGS. 6 and 7. For example, the storage manager 810 may cause or instruct one or more components to store, at a set of latches, a memory address associated with a memory component identified as unreliable. The storage manager 810 may also cause or instruct one or more components to store, at a latch, a bit that indicates that the set of latches is storing the memory address. The signaling manager 820 may cause or instruct one or more components to send a signal representing the bit to a switching component coupled with the set of latches and a power supply. And the component manager 825 may cause or instruct one or more components to activate the switching component, based at least in part on the signal representing the bit, to couple the power supply with the set of latches.

In some examples, the storage manager 810 may cause or instruct one or more components to store, at a second set of latches, a second memory address associated with a second memory component identified as unreliable. In such cases, activating the switching component may couple the power supply with the second set of latches.

In some examples, the storage manager 810 may cause or instruct one or more components to store at a second latch, a second bit that indicates whether a second set of latches is storing a second memory address associated with a second memory component identified as unreliable. In such cases, the component manager 825 may cause or instruct one or more components to modify a state of a second switching component based at least in part on the second bit. In such cases, the second switching component may be coupled with the power supply and the second set of latches.

In some examples (e.g., when the second bit indicates that the second set of latches is storing the second memory address), the component manager 825 may cause or instruct one or more components to deactivate the switching component so as to isolate the power supply from the second set of latches.

In some examples (e.g., when the at least one second bit indicates that the second set of latches is not storing the second memory address), the component manager 825 may cause or instruct one or more components to activate the second switching component so as to establish a conductive path from the power supply to the second set of latches.

Figure 9:
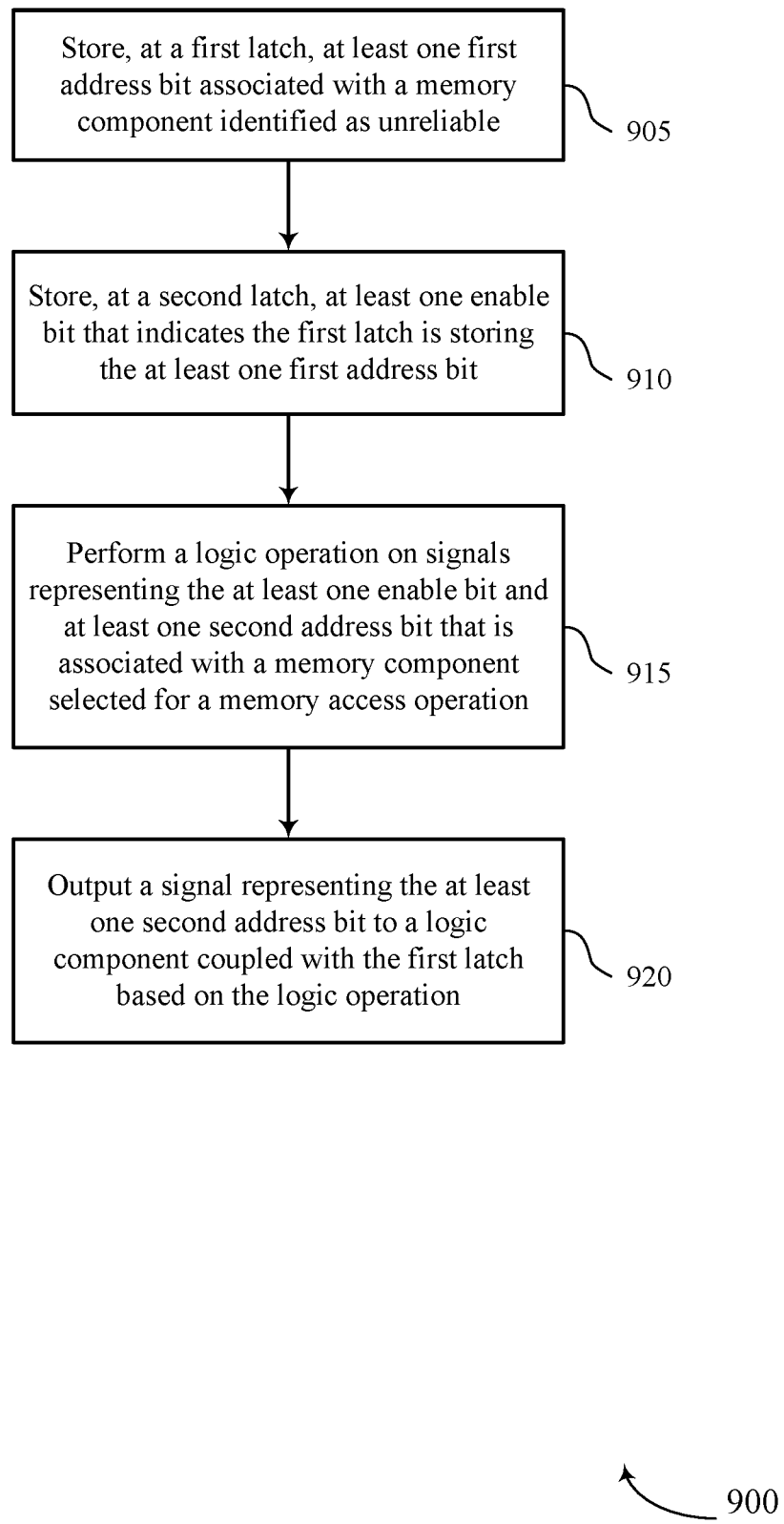
FIGS. 9 and 10 show flowcharts illustrating a method or methods that support an efficient power scheme for redundancy in accordance with examples as disclosed herein.

FIG. 9 shows a flowchart illustrating a method or methods 900 that supports an efficient power scheme for redundancy in accordance with examples as disclosed herein. The operations of method 900 may be implemented by a memory controller or its components as described herein. For example, the operations of method 900 may be performed by a memory controller as described with reference to FIG. 8. In some examples, a memory controller may execute a set of instructions to control the functional elements of the memory controller to perform the described functions. Additionally or alternatively, a memory controller may perform the described functions using special-purpose hardware.

At 905, the method may include storing, at a first latch (e.g., latch 420-a-11), a first address bit associated with a memory component identified as unreliable. The operations of 905 may be performed according to the methods described herein. In some examples, the operations of 905 may be performed by a storage manager as described with reference to FIG. 8.

At 910, the method may include storing, at a second latch (e.g., latch 420-b), an enable bit that indicates the first latch is storing the at least one first address bit. The operations of 910 may be performed according to the methods described herein. In some examples, the operations of 910 may be performed by a storage manager as described with reference to FIG. 8.

At 915, the method may include performing a logic operation (e.g., an AND operation) on signals representing the enable bit and a second address bit that is associated with a memory component selected for a memory access operation. The operations of 915 may be performed according to the methods described herein. In some examples, the operations of 915 may be performed by a logic manager as described with reference to FIG. 8.

At 920, the method may include outputting a signal representing the second address bit to a logic component (e.g., XOR component 425-a) coupled with the first latch based on the logic operation. The operations of 920 may be performed according to the methods described herein. In some examples, the operations of 920 may be performed by a signaling manager as described with reference to FIG. 8.

In some examples, an apparatus as described herein may perform a method or methods, such as the method 900. The apparatus may include features, means, or instructions (e.g., a non-transitory computer-readable medium storing instructions executable by a processor) for storing, at a first latch, at least one first address bit associated with a memory component identified as unreliable, storing, at a second latch, at least one enable bit that indicates the first latch is storing the at least one first address bit, performing a logic operation on signals representing the at least one enable bit and at least one second address bit that is associated with a memory component selected for a memory access operation, and outputting a signal representing the at least one second address bit to a logic component coupled with the first latch based on the logic operation.

Some examples of the method 900 and the apparatus described herein may further include operations, features, means, or instructions for performing, at the logic component (e.g., XOR component 425-a), a second logic operation on signals representing the at least one first and second address bits, and outputting a second signal based on the second logic operation. In such examples, the method 900 and the apparatus described herein may further include operations, features, means, or instructions for performing, at a second logic component (e.g., AND component 430), a third logic operation on the second signal output by the logic component and a third signal representing the at least one enable bit, and outputting a fourth signal (e.g., the match signal) indicating whether the at least one first address bit matches the at least one second address bit based on the third logic operation.

Some examples of the method 900 and the apparatus described herein may further include operations, features, means, or instructions for receiving, at a second logic component (e.g., AND component 530), the at least one enable bit from the second latch (e.g., latch 420-b), and receiving, at the second logic component, the at least one second address bit (e.g., from latch 420-a-11). In such cases, the second logic component may perform the logic operation on the enable bit and the second address bit.

Some examples of the method 900 and the apparatus described herein may further include operations, features, means, or instructions for inverting (e.g., at inverter 535) the at least one second address bit after performing the logic operation, and signaling the at least one inverted second address bit to the logic component (e.g., XOR component 425-a) coupled with the first latch (e.g., latch 420-a-11).

Some examples of the method 900 and the apparatus described herein may further include operations, features, means, or instructions for performing (e.g., at AND component 430) a second logic operation on signals representing the at least one first address bit, the at least one second address bit, and the at least one inverted second address bit.

In some examples, the method 900 may be performed by an apparatus. The apparatus may include a first latch (e.g., latch 320-*a* or latch 420-*a*-11) configured to store at least one address bit associated with an access line identified as defective, a second latch (e.g., latch 320-*b* or latch 420-*b*) configured to store at least one bit (e.g., an enable bit) that indicates that the first latch is storing the at least one address bit, a first logic component (e.g., logic component 325-*a* or XOR component 425-*a*) coupled with the first latch and configured to perform a logic operation on a signal representing the at least one address bit stored at the first latch, and a second logic component (e.g., AND component 530) coupled with the second latch and configured to send, to the first logic component based on the at least one bit stored at the second latch, a second signal representing at least one second address bit associated with an access line selected for a memory access operation.

Some examples of the apparatus may include a conductive path (e.g., conductive path 540-*c*) coupled with an output of the second latch and an input of the second logic component, and a second conductive path (e.g., conductive path 540-*a*) coupled with an output of the second logic component and an input of the first logic component. In such examples, the apparatus may include an inverter (e.g., inverter 535) coupled with the output of the second logic component, and a third conductive path (e.g., conductive path 540-*b*) coupled with an output of the inverter and a second input of the first logic component.

Some examples of the apparatus may include a third logic component (e.g., logic component 325-*b* or AND component 430) coupled with an output of the first logic component and an output of the second latch.

In some examples, the first latch may be configured to output the signal representing the at least one address bit to the first logic component and the second latch may be configured to output a third signal representing the at least one bit to the second logic component.

In some examples (e.g., when the second logic component is an AND component), the apparatus may include an inverter (e.g., inverter 535) coupled with the AND component and the first logic component. The inverter may be configured to send a third signal representing a complemented version of the at least one second address bit to the first logic component.

Figure 10:
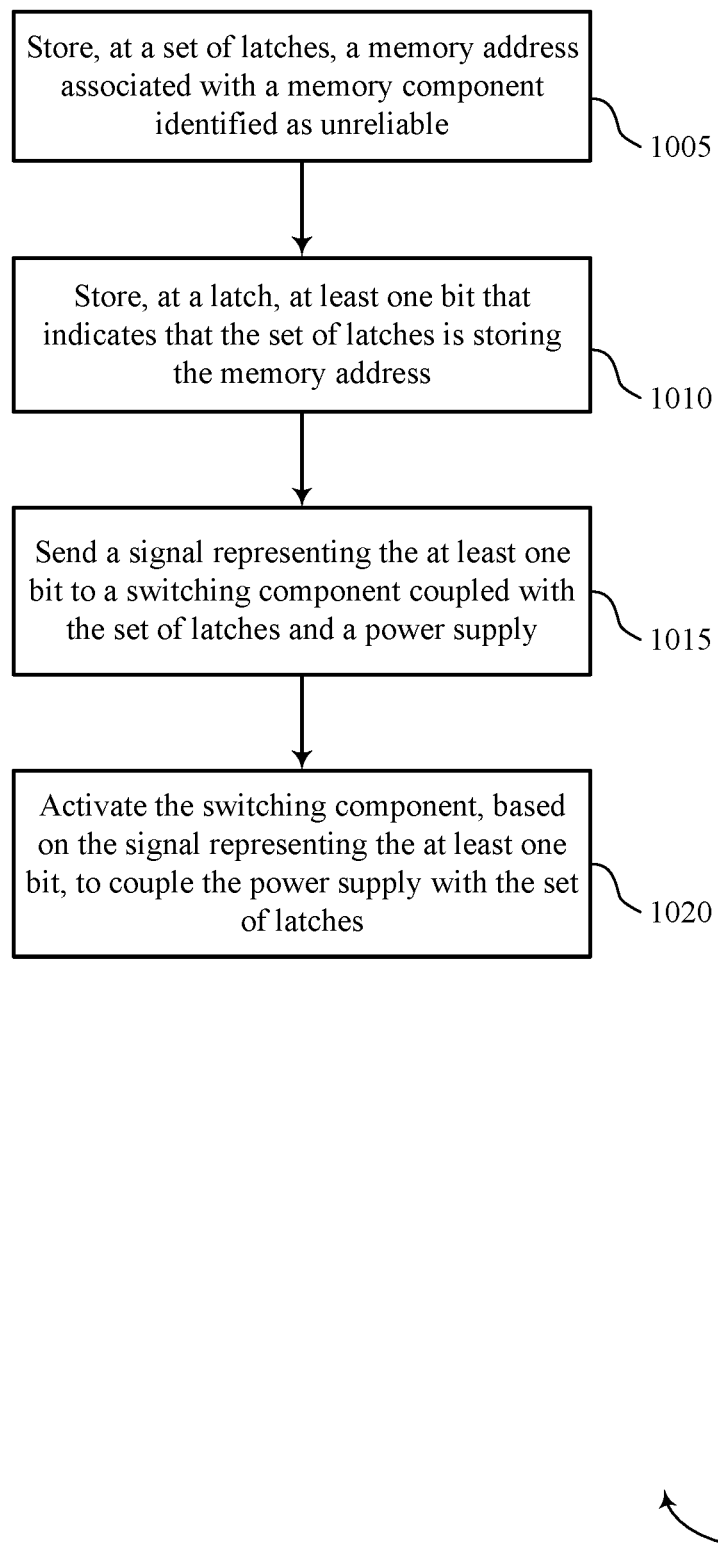

FIG. 10 shows a flowchart illustrating a method or methods 1000 that supports an efficient power scheme for redundancy in accordance with examples as disclosed herein. The operations of method 1000 may be implemented by a memory controller or its components as described herein. For example, the operations of method 1000 may be performed by a memory controller as described with reference to FIG. 8. In some examples, a memory controller may execute a set of instructions to control the functional elements of the memory controller to perform the described functions. Additionally or alternatively, a memory controller may perform the described functions using special-purpose hardware.

At 1005, the method may include storing, at a set of latches, a memory address associated with a memory component identified as unreliable. The set of latches may be included, for example, in a repair circuit such as repair circuit 715-*a*. The operations of 1005 may be performed according to the methods described herein. In some examples, the operations of 1005 may be performed by a storage manager as described with reference to FIG. 8.

At 1010, the method may include storing, at a latch, at least one bit that indicates that the set of latches is storing the memory address. In some examples, the latch may be include in the repair circuit. The operations of 1010 may be performed according to the methods described herein. In some examples, the operations of 1010 may be performed by a storage manager as described with reference to FIG. 8.

At 1015, the may include sending a signal representing the at least one bit to a switching component (e.g., switching component 720-*a*) coupled with the set of latches and a power supply (e.g., power supply 725-*a*). The operations of 1015 may be performed according to the methods described herein. In some examples, the operations of 1015 may be performed by a signaling manager as described with reference to FIG. 8.

At 1020, the method may include activating the switching component, based on the signal representing the at least one bit, to couple the power supply with the set of latches. The operations of 1020 may be performed according to the methods described herein. In some examples, the operations of 1020 may be performed by a component manager as described with reference to FIG. 8.

In some examples, an apparatus as described herein may perform a method or methods, such as the method 1000. The apparatus may include features, means, or instructions (e.g., a non-transitory computer-readable medium storing instructions executable by a processor) for storing, at a set of latches, a memory address associated with a memory component identified as unreliable, storing, at a latch, at least one bit that indicates that the set of latches is storing the memory address, sending a signal representing the at least one bit to a switching component coupled with the set of latches and a power supply, and activating the switching component, based on the signal representing the at least one bit, to couple the power supply with the set of latches.

Some examples of the method 1000 and the apparatus described herein may further include operations, features, means, or instructions for storing, at a second set of latches, a second memory address associated with a second memory component identified as unreliable. In such cases, activating the switching component may couple the power supply with the second set of latches. The set of latches may be included in a repair circuit (e.g., repair circuit 615-*a*) included in logical group 610 or the second of latches may be included in a repair circuit (e.g., repair circuit 715-*a*) included in logical group 710. The method 1000 and the apparatus described herein may further include operations, features, means, or instructions for storing, at a second latch, at least one second bit that indicates whether a second set of latches may be storing a second memory address associated with a second memory component identified as unreliable, and modifying a state of a second switching component (e.g., switching component 720-*b*) based on the at least one second bit. The second switching component may be coupled with the power supply and the second set of latches.

In some examples of the method 1000 and the apparatus described herein, the operations, features, means, or instructions for modifying the state of the second switching component may include operations, features, means, or instructions for deactivating the switching component (e.g., when the at least one second bit indicates that the second set of latches may be storing the second memory address) to isolate the power supply from the second set of latches.

In some examples of the method 1000 and the apparatus described herein, the operations, features, means, or instructions for modifying the state of the second switching component may include operations, features, means, or instructions for activating the second switching component (e.g., when the at least one second bit indicates that the second set of latches may be not storing the second memory address) to establish a conductive path from the power supply to the second set of latches.

It should be noted that the methods described above describe possible implementations, and that the operations and the steps may be rearranged or otherwise modified and that other implementations are possible. Furthermore, portions from two or more of the methods may be combined.

In some examples, the method 1000 may be performed by an apparatus. The apparatus may include a set of latches (e.g., in a repair circuit 615-a or 715-a) configured to store memory address information, a latch (e.g., in the same repair circuit) configured to store at least one bit that indicates whether the set of latches stores a memory address associated with an access line identified as defective, a power supply (e.g., power supply 625 or power supply 725-a) coupled with the set of latches and the latch, and a switching component (e.g., switching component 620 or switching component 720-a) coupled with the latch and configured to activate or deactivate based on the at least one bit stored at the latch.

In some examples, the switching component may be coupled with an output of the latch and may be configured to receive a signal representing the at least one bit.

In some examples, the switching component may be configured to establish a conductive path from the power supply to the set of latches when the at least one bit indicates that the set of latches stores the memory address.

In some examples, the switching component may be configured to isolate the power supply from the set of latches when the at least one bit indicates that the set of latches stores information different than the memory address.

Some examples of the apparatus may include a second set of latches (e.g., in another repair circuit 615 or repair circuit 715-b) configured to store a second memory address associated with a second access line identified as defective, and a second latch configured to store at least one second bit that indicates whether the second set of latches stores the second memory address.

In some examples, the switching component (e.g., switching component 620) may be configured to isolate the power supply from the second set of latches and the second latch when the at least one bit stored by the latch indicates that the set of latches stores information different than memory address information.

Some examples of the apparatus may include a second switching component (e.g., switching component 720-b) coupled with the second latch and configured to establish a second conductive path from the power supply to the second set of latches based on the at least one second bit stored at the second latch.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a first latch configured to store an address bit associated with an access line identified as defective;
a second latch configured to store at least one bit that indicates that the first latch is storing the address bit;
a first logic component coupled with the first latch and configured to perform a logic operation on a signal representing the address bit stored at the first latch;
a second logic component coupled with the second latch and configured to send, to the first logic component based at least in part on the at least one bit stored at the second latch, a second signal representing a second address bit associated with an access line selected for a memory access operation; and
a third logic component coupled with an output of the first logic component and coupled with an output of the second latch, and configured to receive the signal representing the address bit from the first logic component and the at least one bit from the second latch.

2. The apparatus of claim 1, further comprising:
a conductive path coupled with an output of the second latch and an input of the second logic component; and
a second conductive path coupled with an output of the second logic component and an input of the first logic component.

3. The apparatus of claim 2, further comprising:
an inverter coupled with the output of the second logic component; and
a third conductive path coupled with an output of the inverter and a second input of the first logic component.

4. The apparatus of claim 1, wherein the first latch is configured to output the signal representing the address bit to the first logic component and the second latch is configured to output a third signal representing the at least one bit to the second logic component.

5. The apparatus of claim 1, wherein the second logic component comprises an AND component, the apparatus further comprising: an inverter coupled with the AND component and the first logic component, the inverter configured to send a third signal representing a complemented version of the second address bit to the first logic component.

6. A method, comprising:
storing, at a first latch, a first address bit associated with a memory component identified as unreliable;
storing, at a second latch, an enable bit that indicates the first latch is storing the first address bit;
performing, at a logic component coupled with the second latch and an input of a second logic component coupled with an output of the first latch, a logic operation on signals representing the enable bit and a second address bit that is associated with a memory component selected for a memory access operation; and
outputting, by the logic component, a signal representing the second address bit to the second logic component coupled with the output of the first latch based at least in part on the logic operation.

7. The method of claim 6, further comprising:
performing, at the second logic component, a second logic operation on signals representing the first and second address bits; and
outputting a second signal based at least in part on the second logic operation.

8. The method of claim 7, further comprising:
performing, at a third logic component, a third logic operation on the second signal output by the second logic component and a third signal representing the enable bit; and
outputting a fourth signal indicating whether the first address bit matches the second address bit based at least in part on the third logic operation.

9. The method of claim 6, further comprising:
receiving, at the logic component, the enable bit from the second latch; and
receiving, at the logic component, the second address bit.

10. The method of claim 6, further comprising:
inverting the second address bit after performing the logic operation; and
signaling the inverted second address bit to the second logic component coupled with the first latch.

11. The method of claim 10, further comprising:
performing a second logic operation on signals representing the first address bit, the second address bit, and the inverted second address bit.

12. The method of claim 6, further comprising:
performing, at a third logic component coupled with an output of the second latch and an output of the second logic component, a second logic operation on a second signal output by the second logic component and a third signal representing the enable bit.

* * * * *